US006746927B2

United States Patent
Kammler et al.

(10) Patent No.: US 6,746,927 B2
(45) Date of Patent: Jun. 8, 2004

(54) SEMICONDUCTOR DEVICE HAVING A POLYSILICON LINE STRUCTURE WITH INCREASED METAL SILICIDE PORTIONS AND METHOD FOR FORMING THE POLYSILICON LINE STRUCTURE OF A SEMICONDUCTOR DEVICE

(75) Inventors: Thorsten Kammler, Ottendorf-Okrilla (DE); Karsten Wieczorek, Dresden (DE); Christof Streck, Coswig (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/422,492

(22) Filed: Apr. 24, 2003

(65) Prior Publication Data

US 2004/0043594 A1 Mar. 4, 2004

(30) Foreign Application Priority Data

Sep. 2, 2002 (DE) .......................... 102 40 422

(51) Int. Cl.[7] ........................................... H01L 21/336
(52) U.S. Cl. ..................... 438/303; 438/304; 438/305
(58) Field of Search ................. 438/303, 304, 438/305, 308, 199, 200, 291

(56) References Cited

U.S. PATENT DOCUMENTS

| | | | | |
|---|---|---|---|---|
| 5,846,057 A | * | 12/1998 | Ferrigno et al. | 416/241 R |
| 5,889,331 A | | 3/1999 | Bai | 257/768 |
| 6,080,630 A | * | 6/2000 | Milic-Strkalj et al. | 438/305 |
| 6,140,192 A | | 10/2000 | Huang et al. | 438/305 |
| 6,232,191 B1 | * | 5/2001 | Jeng et al. | 438/303 |
| 6,245,626 B1 | | 6/2001 | Chen et al. | 438/305 |
| 6,268,253 B1 | * | 7/2001 | Yu | 438/303 |
| 6,277,683 B1 | * | 8/2001 | Pradeep et al. | 438/200 |
| 6,291,354 B1 | | 9/2001 | Hsiao et al. | 438/701 |
| 6,312,998 B1 | * | 11/2001 | Yu | 438/303 |
| 6,342,423 B1 | * | 1/2002 | Ishida et al. | 438/303 |
| 6,365,476 B1 | * | 4/2002 | Talwar et al. | 438/308 |
| 6,372,589 B1 | * | 4/2002 | Yu | 438/304 |
| 6,391,728 B1 | * | 5/2002 | Yu | 438/291 |
| 6,432,784 B1 | * | 8/2002 | Yu | 438/303 |
| 6,501,114 B2 | * | 12/2002 | Cho et al. | 438/303 |
| 6,624,037 B2 | * | 9/2003 | Buynoski et al. | 438/305 |

FOREIGN PATENT DOCUMENTS

DE 199 50 708 C2 10/1989 .......... H01L/21/283

* cited by examiner

*Primary Examiner*—John F. Niebling
*Assistant Examiner*—Walter L. Lindsay, Jr.
(74) *Attorney, Agent, or Firm*—Williams, Morgan & Amerson, P.C.

(57) ABSTRACT

A method is provided for forming polysilicon line structures, such as gate electrodes of field effect transistors, according to which oxide spacers are removed from the sidewalls of the poly gate lines before depositing the liner oxide. Accordingly, after formation of the final spacers, the polysilicon line sidewalls are no longer covered with spacer oxide but all silicide pre-cleans can clear the poly sidewalls completely which thus leads to improved silicidation conditions, resulting in gate lines exhibiting very low sheet resistivity.

36 Claims, 9 Drawing Sheets

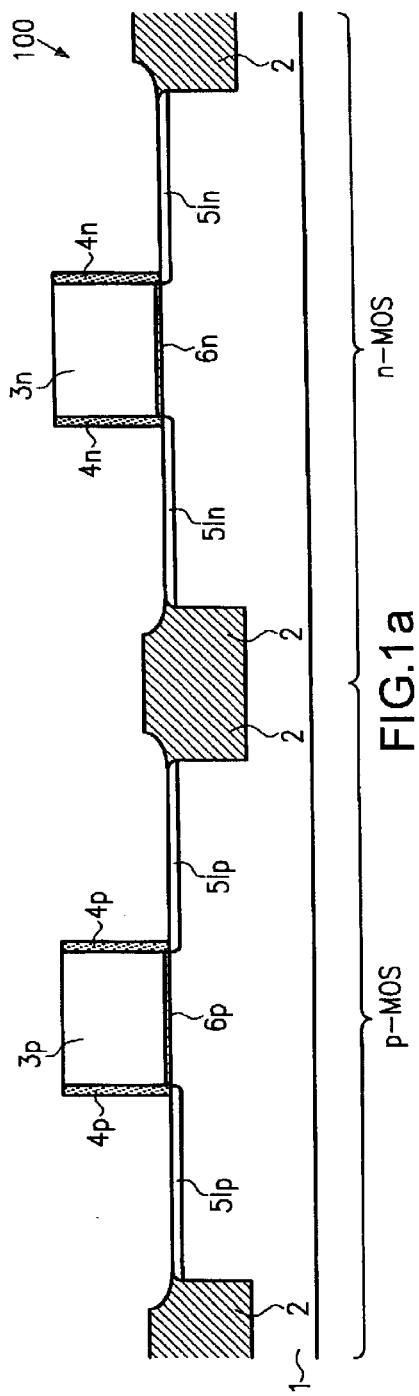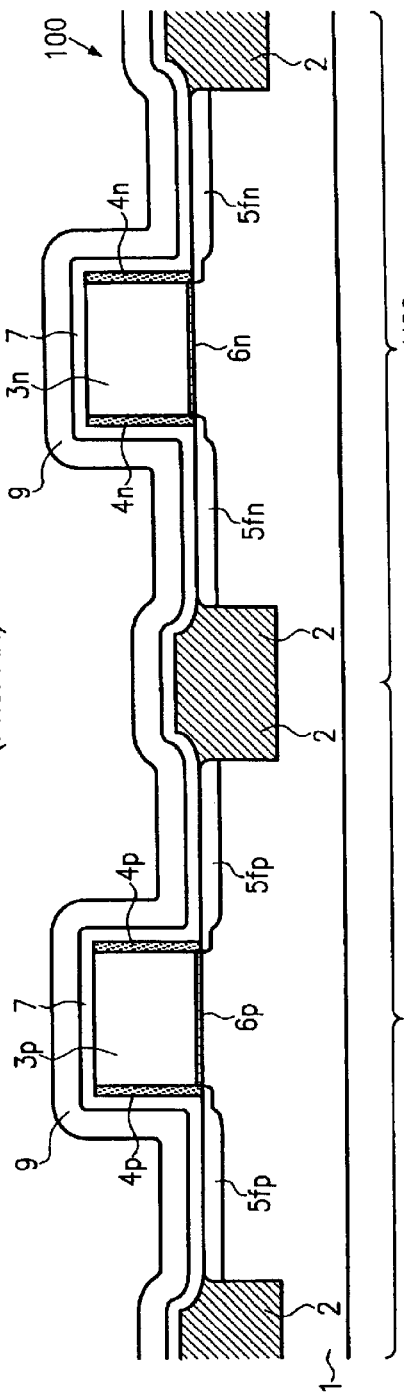
FIG.1a (Prior Art)
FIG.1b (Prior Art)

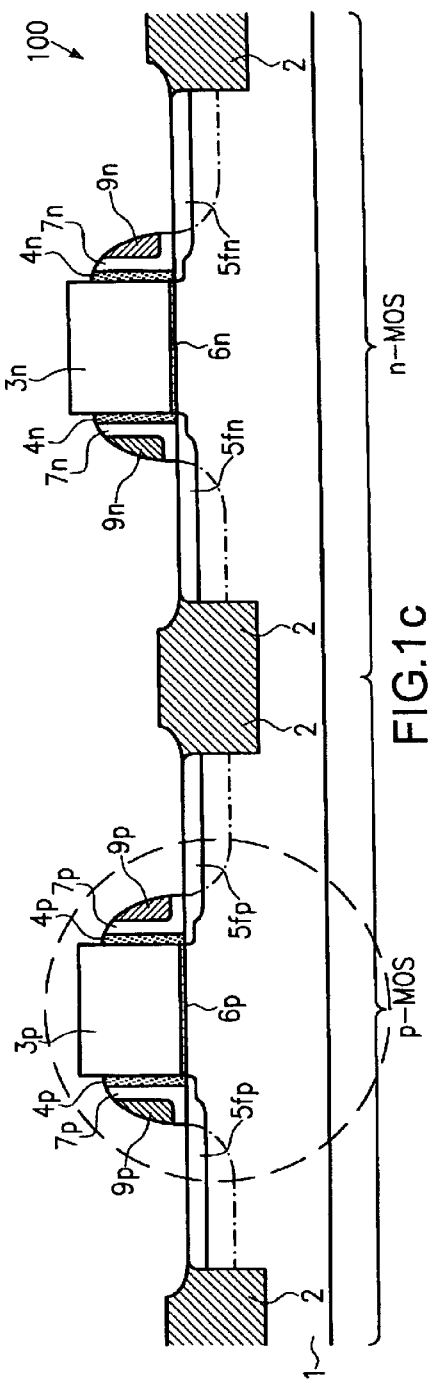
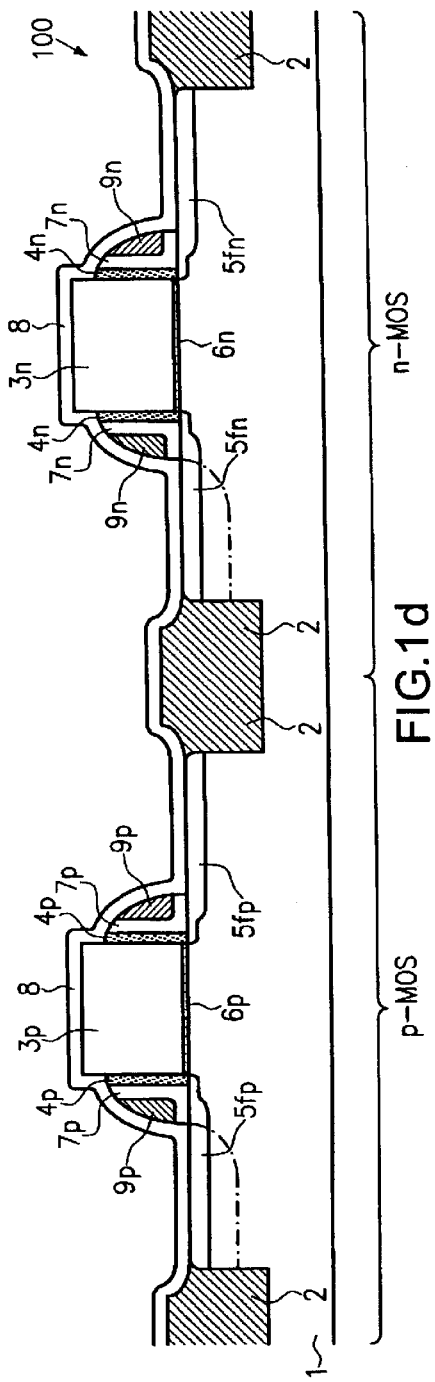
FIG.1c (Prior Art)
FIG.1d (Prior Art)

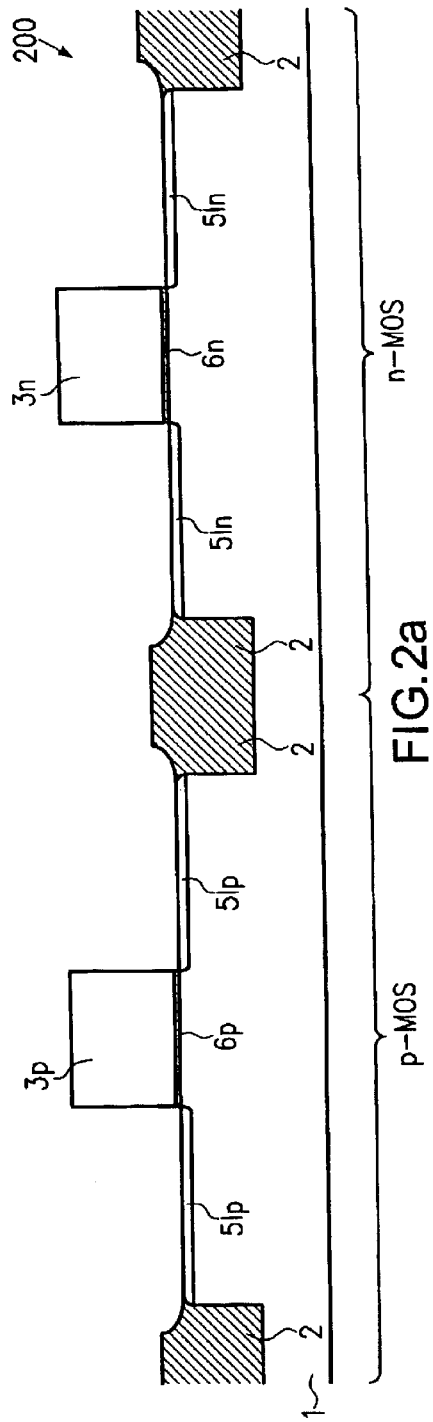
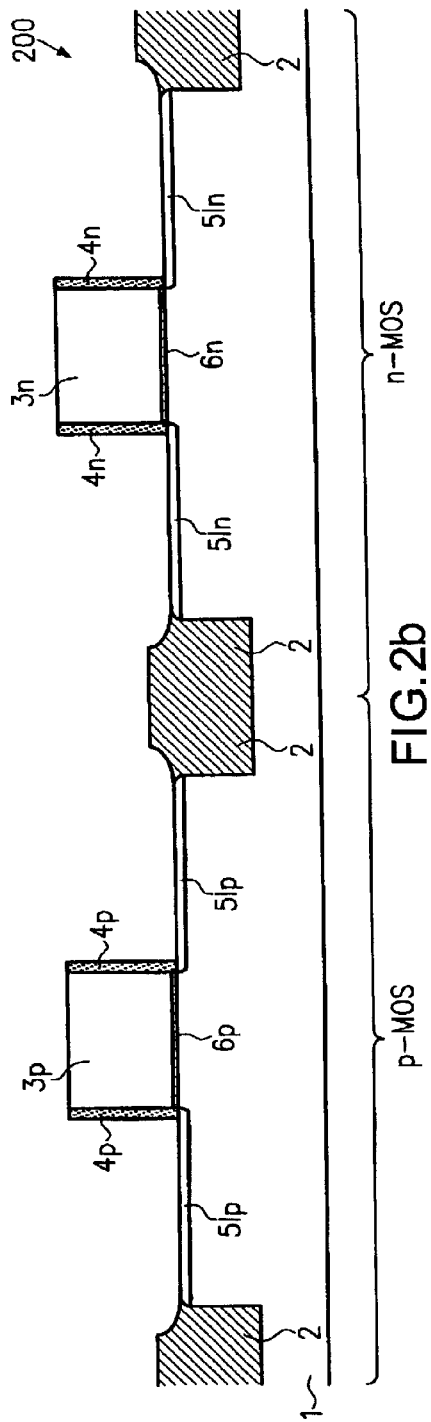
FIG.2a
FIG.2b

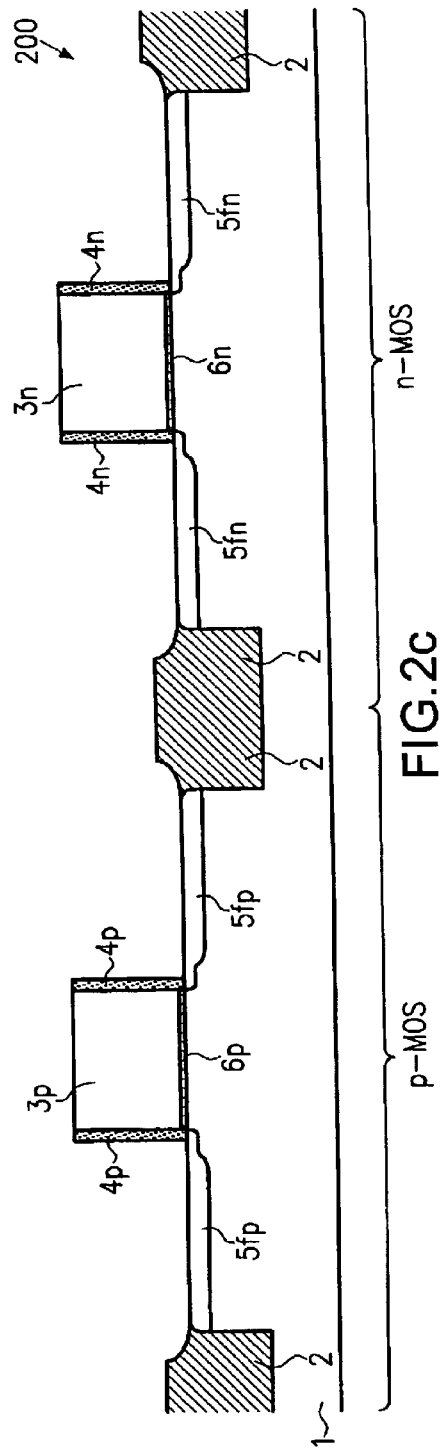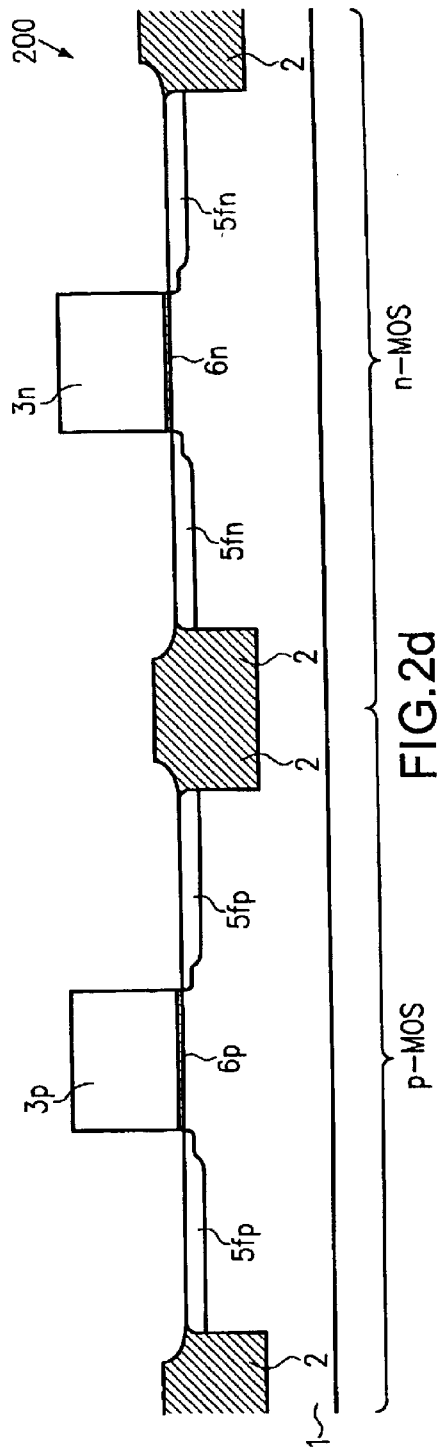

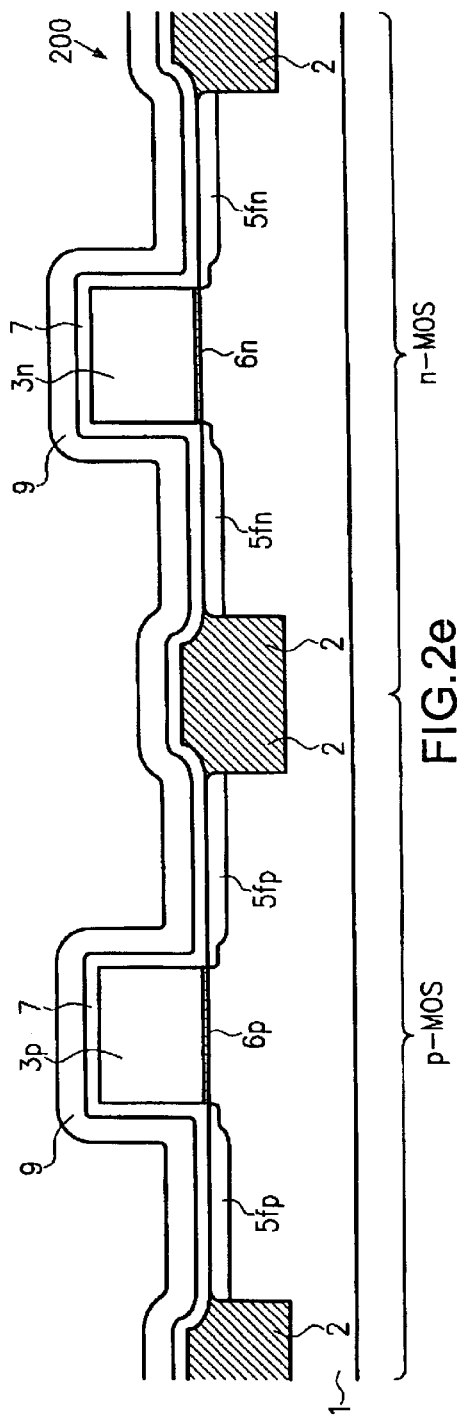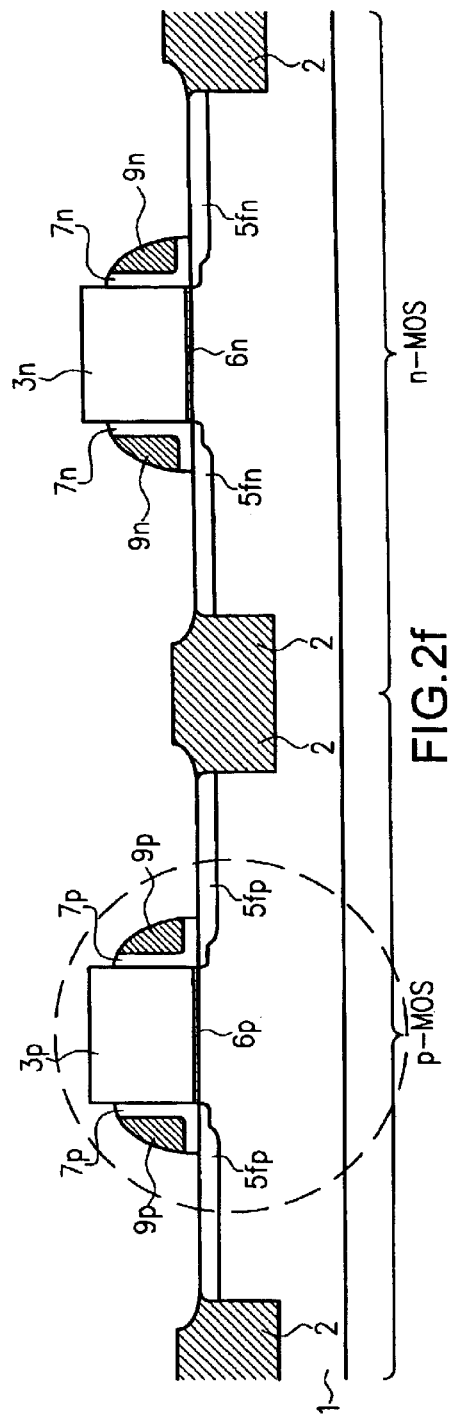

SEMICONDUCTOR DEVICE HAVING A POLYSILICON LINE STRUCTURE WITH INCREASED METAL SILICIDE PORTIONS AND METHOD FOR FORMING THE POLYSILICON LINE STRUCTURE OF A SEMICONDUCTOR DEVICE

BACKGROUND OF THE INVENTION

1. Field of the Invention

The present invention relates to the field of fabrication of integrated circuits, and, more particularly, to a semiconductor device having a polysilicon line structure with metal silicide portions and a method of forming polysilicon line structures with metal silicide portions on active regions of semiconductor devices.

2. Description of the Related Art

In the most common field effect transistors, a gate structure essentially comprises a gate electrode formed above a gate insulation layer, wherein polysilicon is often selected as the material for forming the gate electrode for several reasons.

For instance, polysilicon exhibits high compatibility with the subsequent high temperature processes. Moreover, the polysilicon interface with thermal silicon dioxide is well understood and electrically stable. Furthermore, polysilicon is more reliable than, for example, aluminum gate materials, and polysilicon can be deposited conformally over step topography.

However problems arise when polysilicon is used as a gate material due to its higher resistivity when compared to, e.g., aluminum. In fact, the defects in the grain boundaries of the polysilicon, together with the decreased overall free carrier concentration, cause an increased resistivity of polysilicon lines, such as the gate electrode.

Even when doped at the highest practical concentration, a $0.5\mu$ thick polysilicon film has a sheet resistance of about 20 $\Omega$sq. compared to 0.05 $\Omega$sq. for $0.5\mu$ thick aluminum film. The resulting high values of interconnect polysilicon line resistance can lead to relatively long RC time constants (i.e., long propagation delays) and serious DC voltage variations within VLSI (very large scale integration) circuits.

To overcome this drawback, several solutions have been proposed and developed in the art. Among these solutions, the formation of metal silicides on the top of the polysilicon gate structure has proven to be the most reliable one for obtaining the lowest resistance values.

A typical prior art method of forming metal silicides on silicon-containing regions, such as the gate electrode of a CMOS transistor, will be described in the following with reference to FIGS. 1a–1f.

In FIG. 1a, reference 1 relates to an arbitrary section of a substrate, for instance a silicon wafer, on which a CMOS transistor is to be formed. In particular, in FIG. 1a, reference 2 relates to isolation structures which have been previously formed. These isolation structures divide the section of the substrate 1 into two portions on which the PMOS transistor and the NMOS transistor are to be formed, respectively. In the particular case depicted in FIGS. 1a–1f, the PMOS portion is depicted on the left side of the figures and the NMOS portion on the right side of the figures.

Moreover, in FIG. 1a, references 3p and 3n relate to the gate polysilicon electrodes of the PMOS and NMOS transistors, respectively. References 4p and 4n relate to oxide spacers formed on the sidewalls of the polysilicon gate electrodes. References 6p and 6n relate to the gate insulation layers in the PMOS region and the NMOS region, respectively. Finally, references 5lp and 5ln relate to lightly doped regions in the PMOS and NMOS portions of the transistor, respectively.

In FIGS. 1b–1f, the features already described with reference to FIG. 1a are identified by the same reference numerals. Additionally, in FIG. 1b, a dielectric liner 7 is depicted, for instance an oxide liner, and a layer 9 of a dielectric material, for instance a nitride layer 9, is formed on said dielectric liner 7.

In FIG. 1c, references 4p, 7p and 9p relate to a dielectric spacer, a dielectric liner, and a further dielectric spacer formed on the sidewalls of the gate electrode 3p of the PMOS transistor, respectively. Also, in FIG. 1c, references 4n, 7n and 9n relate to a dielectric spacer, a dielectric liner, and a further dielectric spacer formed on the sidewalls of the gate electrode 3n of the NMOS transistor, respectively. Furthermore, in FIG. 1c, references 5fp and 5fn relate to doped regions of the PMOS and NMOS portions of the substrate, respectively, with said doped regions 5fp and 5fn having a predefined final dopant concentration.

In FIG. 1d, reference 8 relates to a metal layer deposited on the substrate. In FIG. 1e, references 8sp and 8sn relate to metal silicide layers formed on the gate electrodes 3p and 3n and the doped regions 5fp and 5fn of the PMOS and NMOS portions, respectively. Finally, in FIG. 1f, there is depicted an enlarged view of the portion of FIG. 1c encircled by the dashed line of FIG. 1c.

During the first step, as depicted in FIG. 1a, of the prior art method of forming metal suicides, lightly doped regions 5lp and 5ln are formed. To this end, an ion implantation step is carried out for implanting dopants (for instance, boron and or arsenic) at a low concentration into the regions of the substrate not covered by the gate structures 3p and 3n. An annealing step is then carried out for diffusing the implanted dopants into the substrate. Once the lightly doped regions 5lp and 5ln have been formed, dielectric spacers 4p and 4n are formed on the sidewalls of the gate electrodes 3p and 3n. Usually, the dielectric spacers 4p and 4n are formed by first conformally depositing a dielectric layer (not depicted in the figures) on the substrate and anisotropically etching the dielectric layer so as to remove the dielectric layer from the upper surface of the gate electrodes 3p and 3n and from the lightly doped regions 5lp and 5ln. In this way, dielectric spacers 4p and 4n of a substantially uniform thickness are formed on the sidewalls of the gate electrodes 3p and 3n.

In a next step, as depicted in FIG. 1b, the dielectric liner 7 and the dielectric layer 9 are subsequently formed on a substrate. For instance, the dielectric liner 7 can be an oxide liner and the dielectric layer 9 can be a nitride layer. The liner 7 and the layer 9 are conformally formed and exhibit a substantially uniform thickness, with the dielectric layer 9 being thicker than the dielectric liner 7.

The prior art method is then continued by anisotropically etching the layer 9, the liner 7 and the dielectric spacers 4p and 4n. In particular, as depicted in FIG. 1c, the anisotropic etching process is not stopped once the dielectric layer 9 and the dielectric liner 7 are removed from the regions 5fp and 5fn and the upper surface of the polysilicon gate electrodes 3p and 3n, but is carried out so as to overetch the dielectric layer 9, the dielectric liner 7 and the dielectric spacers 4p and 4n until the upper sidewall portions of the polysilicon gate electrodes 3p and 3n are exposed. In this way, the dielectric spacers 4p and 4n, the liner spacers 7p and 7n, and the nitride spacers 9p and 9n are formed as depicted in FIG. 1c. Once the spacers have been formed, a further implantation step is eventually carried out with the purpose of further modifying the dopant concentration in the portions of the substrate not covered by the spacers so as to form doped regions as identified in FIG. 1c by the dotted-dashed lines.

In a next step, as depicted in FIG. 1d, a metal layer 8 is deposited on the substrate 1. For instance, titanium or cobalt or any other refractory metal such as tantalum, tungsten, zirconium, nickel or a combination thereof may be selected for forming the metal layer 8. Due to the fact that the dielectric sidewall spacers 4p, 7p, 9p and 4n, 7n and 9n do not cover the sidewalls of the polysilicon gate electrodes 3p and 3n completely, i.e., the upper sidewall portions of the polysilicon electrodes 3p and 3n have been exposed during the previous anisotropic overetching step, portions of the metal layer 8 come into contact with the exposed upper sidewall portions of the polysilicon gate electrodes 3p and 3n. Accordingly, a metal-silicon interface is formed, not only on the upper surface of the polysilicon gate electrode 3p and 3n and the doped regions 5fp and 5fn, but a metal-silicon interface is also formed at the upper sidewall portions of the polysilicon gate electrodes 3p and 3n.

Subsequently, in a next step, as depicted in FIG. 1e, a thermal treatment (about 650° C. for titanium; other temperatures may be selected depending on the metal used) is carried out to react the metal and the silicon exposed on the doped regions 5fp and 5fn and the polysilicon gate electrodes 3p and 3n. As a result, vertical diffusion of the polysilicon and silicide-forming metal occurs at the upper surface of the polysilicon gate electrodes 3p and 3ln and the doped regions 5fp and 5fn, along with horizontal diffusion at the metal-polysilicon interface in correspondence with the upper sidewall portions of the polysilicon gate electrodes 3p and 3n. The thermal treatment, therefore, results in the formation of the metal silicide compound layers 8sp and 8sn (see FIG. 1e); the thickness of the layers 8sp and 8sn depends on the type of metal, the initial layer thickness of the metal layer 8 and on the process parameters of the heat treatment. As depicted in FIG. 1e, the metal silicide layers 8sp and 8sn comprise a horizontal portion covering the upper surface of the polysilicon lines 3p and 3n, together with vertical portions extending on the exposed upper sidewall portions of the polysilicon lines 3p and 3n. The vertical portions of the metal silicide layers 8sp and 8sn help in reducing the total sheet resistance of the polysilicon lines 3p and 3n, and are of particular relevance in those applications in which very narrow polysilicon lines are required.

The process is then continued with the removal of the unreacted metal with an etching step (not depicted in the figures), leaving behind the metal silicide compound layers 8sp and 8sn. For instance, a wet etching step can be carried out in which a bath of $H_2O:H_2O_2:NH_4OH$ is used that removes substantially only the unreacted metal.

The prior art method described above has accomplished satisfactory results for devices having minimum feature sizes of 0.5µ and more. The above method, however, is not completely adequate to compensate for the increase of the polysilicon sheet resistance, which arises in cases of deep sub-micron devices, i.e., with features sizes equal to or less than 0.25µ.

The reasons for this can be explained as follows. At the end of the etching step depicted in FIG. 1c, the dielectric spacers 4p and 4n and the dielectric liners 7p and 7n are not etched away as schematically depicted therein. The real situation at the end of this etching step may be illustrated in a more representative manner in FIG. 1f. In particular, as is apparent from FIG. 1f, the upper sidewall portions of the gate electrodes 3p and 3n (indicated as "recess" in FIG. 1f) are not completely exposed but are still partially covered by the remaining dielectric spacers 4p and the dielectric liners 7p which extend vertically beyond the remaining dielectric spacers 9p. This is due to the fact that a single etching step is carried out for etching the dielectric layer 9, the liner 7 and the dielectric spacers 4p of FIG. 1b. Accordingly, since the dielectric layer 9, the liner 7 and the dielectric spacers 4p exhibit different etch rates (with the dielectric layer 9 exhibiting the highest etching rate), the spacers 4p and the liner 7 are not removed from the sidewalls of the polysilicon line 3p to the same extent as the spacers 9p. As a result, as depicted in FIG. 1f, the upper sidewall portions of the polysilicon lines 3p and 3n from which the spacers 9p are removed (corresponding to the "recess" of FIG. 1f) are not completely exposed but residual spacers 4p and liners 7p still partially cover the upper sidewall portions.

Accordingly, the benefit of overetching the spacers 9p is limited by the remaining dielectric material on the gate upper sidewalls consisting of the spacers 4p and the liners 7p, since silicidation by horizontal metal diffusion through the upper sidewalls is hindered by the residual dielectric material. Therefore, relatively small upper sidewall portions of the polysilicon gate electrodes 3p and 3n are converted into a silicide so that metal silicide layers featuring relatively short vertical portions are formed. Accordingly, the metal silicide layers may not significantly contribute to reducing the total sheet resistance of the polysilicon lines 3p and 3n.

Since the trend toward increasing miniaturization of the devices manufacturable on a substrate will continue in years to come, it clearly results that the formation of metal silicide layers on the top of gate polysilicon lines according to the prior art methods would render it very difficult to realize polysilicon line structures featuring resistances in conformity with the electrical performances required.

Accordingly, in view of the problems explained above, it would be desirable to provide a method that may solve or reduce one or more of these problems. In particular, it would be desirable to provide a method of forming polysilicon line structures featuring metal silicide layers of increased dimensions, thus exhibiting low sheet resistance and ensuring high electrical performance of the devices with such polysilicon line structures.

SUMMARY OF THE INVENTION

Generally, the present invention is based on the consideration that metal silicide layers or regions of increased dimensions can be realized if upper sidewall portions of polysilicon lines, such as gate electrodes, interconnect lines and the like, substantially free from oxide residuals, are produced when forming the sidewall spacers. The silicidation through the sidewalls of the polysilicon line is then no longer blocked by residual oxide, and metal silicide layers featuring vertical portions of increased dimensions can be formed on the polysilicon line structures. Accordingly, the sheet resistance of the polysilicon line structures is substantially determined by the silicide layers. This is of particular relevance for those applications where gate structures of field effect transistors have to be formed. In fact, as previously stated, the trend towards ever-increasing miniaturization of the devices requires field effect transistors featuring ever-decreasing channel lengths, i.e., ever-decreasing bottom critical dimensions of the gate structures formed on the channels. Accordingly, the need arises for forming gate structures featuring bottom critical dimensions as small as required by the miniaturization trend, but featuring metal silicide layers large enough for compensating the high values of sheet resistance arising from the miniaturization of the devices.

For this purpose, according to one embodiment, the present invention relates to a method comprising forming at least one feature of a silicon-containing semiconductive material above a substrate, wherein the feature has sidewalls and an upper surface. The method further comprises forming a dielectric layer on the sidewalls of the feature, wherein the dielectric layer covers portions of the substrate adjacent the sidewalls. The method further comprises introducing dopant material into at least the portions of the substrate not covered by the feature and the dielectric layer and removing the dielectric layer so as to expose the sidewalls of the feature. Finally, the method comprises forming spacer elements adjacent a portion of the sidewalls so that the elements cover less than all of the sidewalls and define exposed upper sidewall portions.

According to another embodiment, the method comprises forming at least one polysilicon line above an active region of a substrate and introducing a first dopant material into at least one portion of the active region not covered by the polysilicon line and into the polysilicon line. Moreover, the method comprises forming a dielectric layer on the sidewalls of the polysilicon line, wherein the dielectric layer covers portions of the active region adjacent the sidewalls, and introduces a second dopant material into at least the portions of the active region not covered by the polysilicon line and the dielectric layers. The method further comprises removing the dielectric layer so as to expose the sidewalls of the polysilicon line and forming spacer elements adjacent a portion of the sidewalls, wherein the elements cover less than all of the sidewalls and define exposed upper sidewall portions.

According to a further embodiment, the method comprises forming at least one polysilicon line above a substrate and introducing a first dopant material at a first predefined concentration into at least one portion of the substrate not covered by the polysilicon line and into the polysilicon line. The method further comprises forming a dielectric layer on the sidewalls of the polysilicon line, wherein the dielectric layer covers portions of the substrate adjacent the sidewalls. Moreover, the method comprises introducing a second dopant material at a second predefined concentration higher than the first concentration into at least the portions of the substrate not covered by the polysilicon line and the dielectric layer. Finally, the method comprises removing the dielectric layer so as to expose the sidewalls of the polysilicon line, and forming spacer elements adjacent a portion of the sidewalls, wherein the elements cover less than all of the sidewalls and define exposed upper sidewall portions. A metal silicide layer is formed on at least the upper surface and the exposed upper sidewall portions of the polysilicon line.

In still another embodiment of the present invention, the method comprises forming at least one polysilicon line above the substrate and introducing a first dopant material at the first predefined concentration in at least one portion of the substrate not covered by the polysilicon line and in the polysilicon line. The method further comprises forming a dielectric layer on the sidewalls of the polysilicon line, wherein the dielectric layer covers portions of the substrate adjacent the sidewalls. A second dopant material at a second predefined concentration lower than the first concentration is introduced into at least the portions of the substrate not covered by the polysilicon line and the dielectric layer. The method finally comprises removing the dielectric layer so as to expose the sidewalls of the polysilicon line, forming spacer elements adjacent a portion of the sidewalls, wherein the elements cover less than all of the sidewalls and define exposed upper sidewall portions, and forming a metal silicide layer on at least the upper surface and the exposed upper sidewall portions of the polysilicon line.

BRIEF DESCRIPTION OF THE DRAWINGS

The invention may be understood by reference to the following description taken in conjunction with the accompanying drawings, in which like reference numerals identify like elements, and in which:

FIGS. 1a–1f represent a typical process sequence of a prior art method of forming the gate structure of a CMOS transistor;

FIGS. 2a–2g represent a process sequence of a method of forming gate structures according to a first embodiment of the present invention.

Figure 1E:
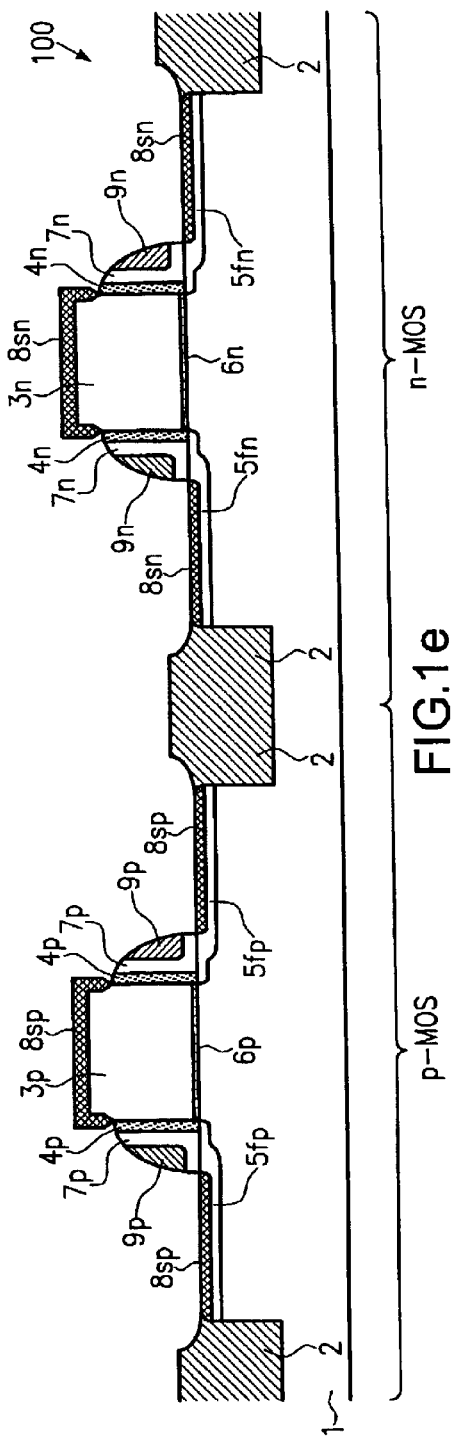

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the gate structures of CMOS transistors. For this reason, examples will be given in the following in which corresponding embodiments of the present invention are utilized for forming the gate structures of a CMOS transistor. However, it has to be noted that the present invention is not limited to the formation of gate structures of CMOS transistors, but can be used in any other situation in which the realization of either oxide spacers or metal silicide layers is required. For example, an integrated circuit may comprise one or more silicon lines connecting two or more semiconductor elements. The present invention is also applicable to these silicon lines and the gate electrodes described above and in the following illustrative embodiments are to represent any silicon line, irrespective of the crystalline structure and the degree and type of doping. Moreover, the present invention is also applicable to those situations in which the formation of spacers is required, for instance for masking purposes before implanting dopants into a substrate. The present invention is also particularly useful when applied to the formation of metal silicide layers. Finally, although described with reference to a CMOS transistor, the present invention also relates to single NMOS transistors, PMOS transistors, and field effect transistors having a gate insulation layer other than an oxide layer.

In FIGS. 2a–2g and 3a–3d, semiconductor structures 200 and 300, respectively, are shown in a schematic cross-sectional view, wherein the features already described with reference to FIGS. 1a–1f are identified by the same reference numerals.

In FIG. 2a, reference 1 relates to an arbitrary section of a substrate, for instance a silicon wafer, on which a CMOS transistor is to be formed. Reference 2 relates to isolation structures which have been previously formed according to processes well known to those skilled in the art. It is assumed that the isolation structures 2 are provided as shallow trench isolation (STI) structures. However, other isolation structures, for instance LOCOS (local oxidation of silicon) structures, could have been formed instead of STI structures. Regardless of the method used, the isolation structures 2 essentially comprise an insulating material, such as silicon oxide or the like. References 3*p* and 3*n* relate to polysilicon gate electrodes, which will also be referred to as gate polysilicon lines, formed on the PMOS portion and the NMOS portion, respectively. References 6*p* and 6*n* relate to the gate insulation layers formed on the PMOS portion and the NMOS portion. Additionally, references 5*lp* and 5*ln* relate to lightly doped regions (LDR) which are normally formed by ion implantation steps.

In FIG. 2b, references 4*p* and 4*n* relate to dielectric spacers, for instance silicon oxide spacers, formed on the sidewalls of the polysilicon lines 3*p* and 3*n*, respectively. In FIG. 2c, references 5*fp* and 5*fn* relate to heavily doped regions formed on the PMOS and NMOS portions of the substrate. FIG. 2d depicts the situation on the substrate once the further heavy implantation step has been carried out and the dielectric spacers 4*p* and 4*n* of FIG. 2c have been removed.

In FIG. 2e, references 7 and 9 relate to a dielectric liner and a dielectric layer, respectively. The dielectric liner 7 and dielectric layer 9 are formed on the substrate for the purpose of forming dielectric spacers on the sidewalls of the polysilicon lines 3*p* and 3*n*, respectively, as will be described in detail in the following.

Figure 2G:
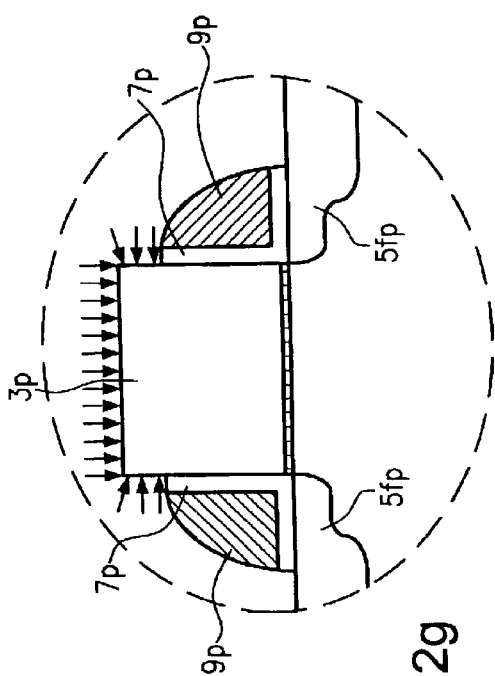

In FIG. 2f, references 7*p* and 9*p* and references 7*n* and 9*n* relate to dielectric spacers formed on the sidewalls of the polysilicon lines 3*p* and 3*n* by etching the dielectric layer 9 and the dielectric liner 7 of FIG. 2e. Finally, FIG. 2g relates to an enlarged view of the portion of FIG. 2f encircled by the dashed line of FIG. 2f.

A typical process flow in accordance with illustrative embodiments of the present invention may be as follows. The isolation structures 2, the gate oxide layers 6*p* and 6*n*, as well as the polysilicon lines 3*p* and 3*n*, may be formed according to techniques well known to those skilled in the art. Then, a first implantation step is performed for the purpose of forming the lightly doped regions 5*lp* and 5*ln* of FIG. 2a. During the first implantation step, ions are implanted in those areas of the substrate 1 not covered by the polysilicon lines 3*p* and 3*n* and the gate oxide layers 6*p* and 6*n*. For instance, a dose of approximately $3 \times 10^{13}$–$3 \times 10^{14}$ cm$^{-2}$ dopant ions is implanted at low energy (30–50 keV). A thermal treatment, for instance an annealing step, is carried out to allow the implanted dopants to diffuse into the substrate so as to form the lightly doped regions 5*lp* and 5*ln*.

The process is then continued by executing a next step as depicted in FIG. 2b. The dielectric layers 4*p* and 4*n* (for instance, oxide layers) are formed on the sidewalls of the polysilicon lines 3*p* and 3*n*, respectively. For instance, to this end, an oxide layer can be formed on the substrate 1 (for example, by conformally depositing a silicon oxide layer with an appropriate well-established deposition technique) so as to cover the lightly doped regions 5*lp* and 5*ln*, the sidewalls of the polysilicon lines 3*p* and 3*n*, as well as the upper surface of the polysilicon lines 3*p* and 3*n*. The dielectric layer (not depicted in FIG. 2b) is subsequently etched away (for instance, according to an anisotropic wet etching step) so that the dielectric layer is removed from the lightly doped regions 5*lp* and 5*ln* and the upper surface of the polysilicon lines 3*p* and 3*n* and the dielectric spacers 4*p* and 4*n* are left on the sidewalls of the polysilicon lines 3*p* and 3*n*, wherein the dielectric layers 4*p* and 4*n* substantially cover all sidewalls of the polysilicon lines 3*p* and 3*n*.

In a next step, as depicted in FIG. 2c, a further ion implantation step is carried out for the purpose of implanting dopants into the regions of the substrate not covered by the polysilicon lines 3*p* and 3*n* and the dielectric spacers 4*p* and 4*n*. A high dose implantation step is performed followed by a thermal treatment (for instance, an annealing step) so as to form doped regions 5*fp* and 5*fn* of a predefined final concentration. The heavily doped regions 5*fp* correspond to the source and drain regions of the PMOS transistor. In the same way, the heavily doped regions 5*ft* correspond to the source and drain regions of the NMOS transistor.

Next, as shown in FIG. 2d, the dielectric spacers 4*p* and 4*n* are removed, for instance by a wet etching process. Since no other dielectric features are present on the substrate at this stage of manufacturing, the etching process can be carried out until the dielectric layers are substantially completely removed, but without any risk of other dielectric features being damaged or etched away during this etching step. On the contrary, if the dielectric spacers 4*p* and 4*n* are etched later during the manufacturing process, the duration of the etching process is defined by the etching rate of other dielectric features which are etched together with the dielectric spacers 4*p* and 4*n*. Therefore, the etching process has to be stopped as soon as the final dimensions required for the other dielectric features have been reached, irrespective of whether the dielectric spacers 4p and 4n have been satisfactorily removed or not. For instance, in the prior art method as described above, the dielectric spacers 4p and 4n are etched during the etching process carried out for forming the dielectric spacers 7p, 9p and 7n, 9n of FIG. 1*d*. However, the etching process must be stopped as soon as the final dimensions for the dielectric spacers 7p, 9p and 7n, 9n have been reached. Even in those cases in which the dielectric spacers 4p and 4n are not completely removed but residual dielectric material is left on the sidewalls of the polysilicon lines 3p and 3n (see FIG. 1*f*), the etching process may not be continued, since otherwise the dielectric spacers 7p, 9p and 7n, 9n would be overetched to final dimensions that do not accomplish the design layout sizes of the dielectric spacers. Finally, it has to be noted that at the moment during the manufacturing process when the dielectric spacers 4p and 4n are removed according to the present invention, both the light ion implantation step and the heavy ion implantation step have been performed and the final desired concentration of dopants for the regions 5fp and 5fn has already been obtained; accordingly, the dielectric spacers 4p and 4n are no longer necessary for masking purposes. Moreover, although the dielectric spacers 4p and 4n are removed, final dielectric sidewall spacers featuring the desired horizontal dimension can be obtained, for instance by increasing the thickness of the dielectric liner 7 and the dielectric layer 9, which are subsequently formed on the substrate for the purpose of forming the dielectric sidewall spacers.

The process is then performed by first forming a dielectric liner 7 on the substrate (for instance, an oxide liner) and forming thereon a dielectric layer 9 (for instance, a nitride layer), as depicted in FIG. 2*e*. The oxide liner 7 is formed since it exhibits improved adhesion to the underlying polysilicon lines and exposed silicon regions. The nitride layer 9 is formed on the oxide liner 7 (for instance, according to a well-known deposition process), since nitride allows itself to be conformally deposited, i.e., allows relatively thick layers to be deposited at a uniform thickness. The thickness of the dielectric layer 9 is selected in accordance with the final horizontal dimensions of the dielectric sidewall spacers 7p, 9p, 7n, 9n.

Figure 1F:
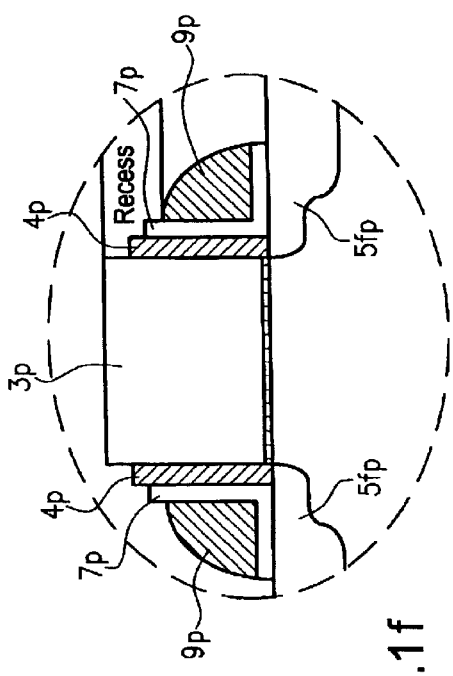

In a further step, as depicted in FIG. 2*f*, the oxide liner 7 and the nitride layer 9 are etched back during a single etching step. To this end, for instance, a dry-etching process can be carried out. The goal of the etching step is the formation of the dielectric sidewall spacers 7p, 9p and 7n, 9n depicted in FIG. 2*f*, namely dielectric sidewall spacers which do not completely cover the sidewalls of the polysilicon gate electrodes 3p and 3n but leave the upper sidewall portions of the polysilicon lines 3p and 3n uncovered. To this end, the anisotropic etching process is not stopped once the dielectric material is removed from the source and drain regions 5fp and 5fn and the upper surface of the polysilicon gate electrodes 3p and 3n, but is continued to overetch the nitride layer 9 and the oxide liner 7 until portions of the nitride layer 9 and the oxide liner 7 on the sidewalls of the polysilicon gate electrodes 3p and 3n are removed and the upper sidewall portions of the polysilicon gate electrodes 3p and 3n are exposed. Since the etching rates of the nitride layer 9 and the oxide liner 7 are comparable and are known in advance, exposing the upper sidewall portions of the polysilicon gate electrodes 3p and 3n can be obtained by opportunely selecting the overall duration of the etching process. Moreover, since the dielectric layers 4p and 4n have been previously removed, the sidewalls of the polysilicon lines 3p and 3n are no longer covered with oxide spacers 4p and 4n. Accordingly, at the end of the etching process, a situation as depicted in FIG. 1*f* may be avoided, namely, residual oxide spacers 4p (and 4n) are still present in a considerable amount on the sidewalls of the polysilicon lines and at least partially obstruct the recesses formed during the etching step. In the present invention, as depicted in FIG. 2*g*, the upper sidewall portions of the polysilicon lines 3p and 3n are substantially completely exposed essentially without any residual oxide and/or dielectric material obstructing the upper sidewall portions. Thus, exposed upper sidewall portions of increased dimensions are obtained.

The manufacturing process is then continued with the formation of metal suicide layers on the polysilicon lines 3p and 3n and the source and drain regions 5fp and 5fn. To this end, a metal layer (not depicted in the figures) is first deposited on the substrate and subsequently at least partially reacted into metal silicide at the metal polysilicon and metal silicon interfaces. However, since the dielectric spacers 4p and 4n have been previously removed and exposed upper sidewall portions of increased dimensions have been obtained during the etching step depicted in FIG. 2*f*, silicidation through the polysilicon line sidewalls is no longer hindered or blocked by residual dielectric material on the sidewalls of the polysilicon lines, and metal silicide layers featuring vertical portions of increased dimensions can be formed. Accordingly, the final, total resistance of the gate electrodes is improved by the silicide layers so that polysilicon gate structures exhibiting low sheet resistivity can be formed.

The sequence described above may be modified according to further illustrative embodiments described with reference to FIGS. 3*a*–3*d*. In the semiconductor structure 300, the dielectric spacers 4p and 4n are formed first, i.e., before an ion implantation step for forming the heavily doped regions 5hp and 5hn is carried out. In other embodiments, a pre-doping of the polysilicon line 3p and/or 3n and/or of the active PMOS and/or the active NMOS region may be performed prior to forming the dielectric spacers 4p and 4n by correspondingly masking the NMOS region and/or the PMOS region. Moreover, an additional sidewall spacer (not shown) may be formed for the pre-doping. Again, the dielectric spacers 4p and 4n can be formed by first depositing a dielectric layer (not depicted in the figures) on the sidewalls and the upper surface of the polysilicon lines 3p and 3n, as well as on the portions of the substrate not covered by said polysilicon lines 3p and 3n. Subsequently, an anisotropic etching step is carried out so as to remove the dielectric layer from the upper surface of the polysilicon lines 3p and 3n and the portions of the substrate not covered by the polysilicon lines 3p and 3n. These spacers 4p and 4n cover and mask the regions of the substrate 1 adjacent to the sidewalls of the polysilicon lines 3p and 3n from the subsequent ion implantation step.

Figure 3A:
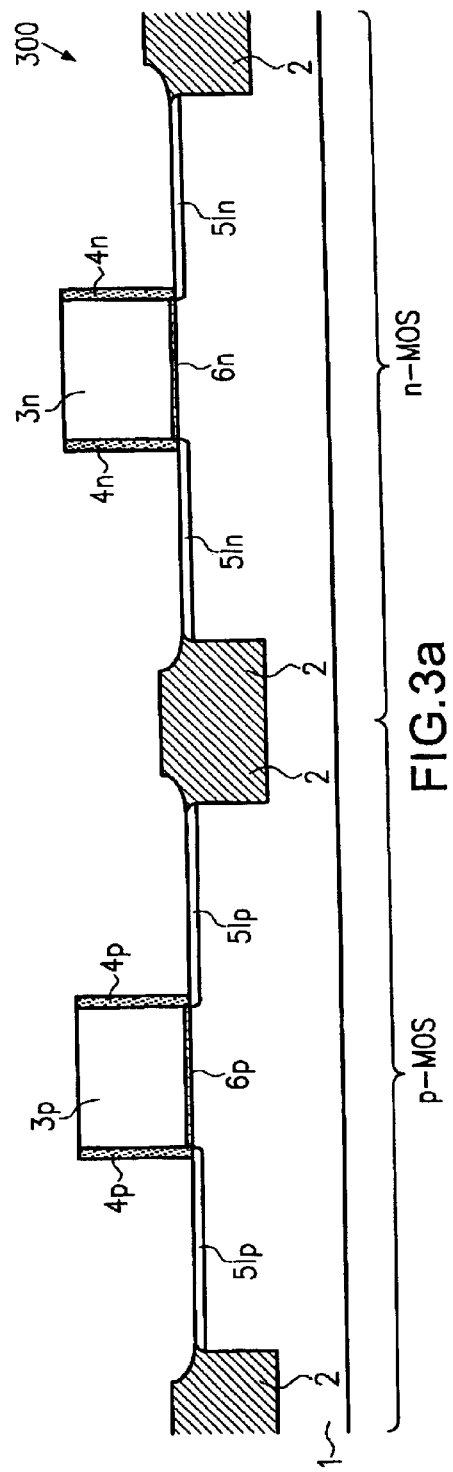
FIGS. 3a–3d represent an example of the way the process sequence depicted in FIGS. 2a–2g can be modified according to another embodiment of the present invention.
Figure 3B:
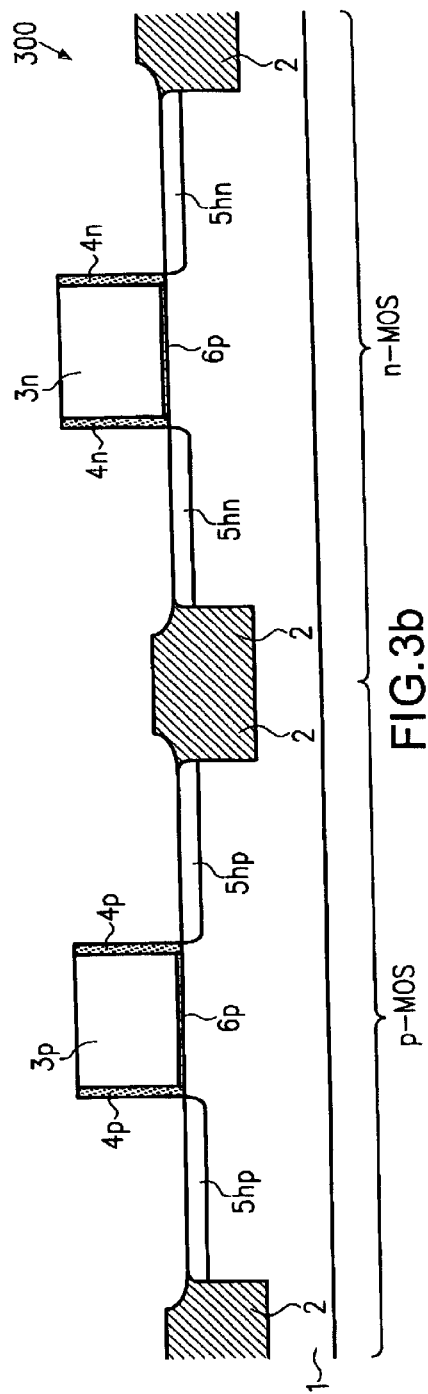

Accordingly, in a subsequent step, as depicted in FIG. 3*b*, a heavy dose of dopant is implanted into the exposed portions of the substrate; for instance, a dose of $1 \times 10^{15} - 5 \times 10^{15}$ ions/cm$^{-2}$ at 40–80 keV is used for this step. Once the dopants have been implanted, a thermal treatment is carried out for diffusing the implanted dopants into the substrate so as to form the heavily doped regions 5hp and 5hn depicted in FIG. 3*b*.

Figure 3C:
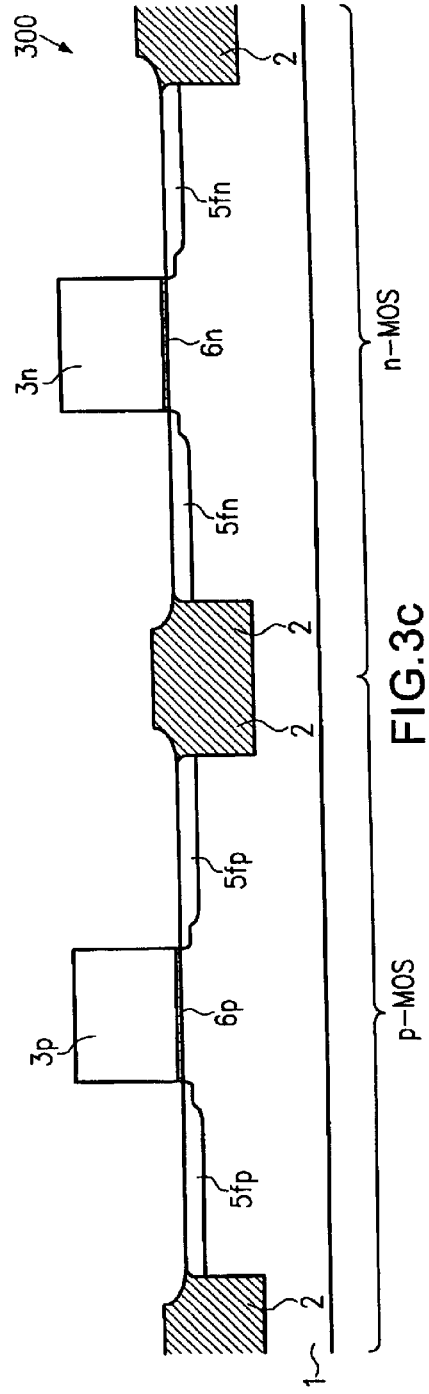
Figure 3D:
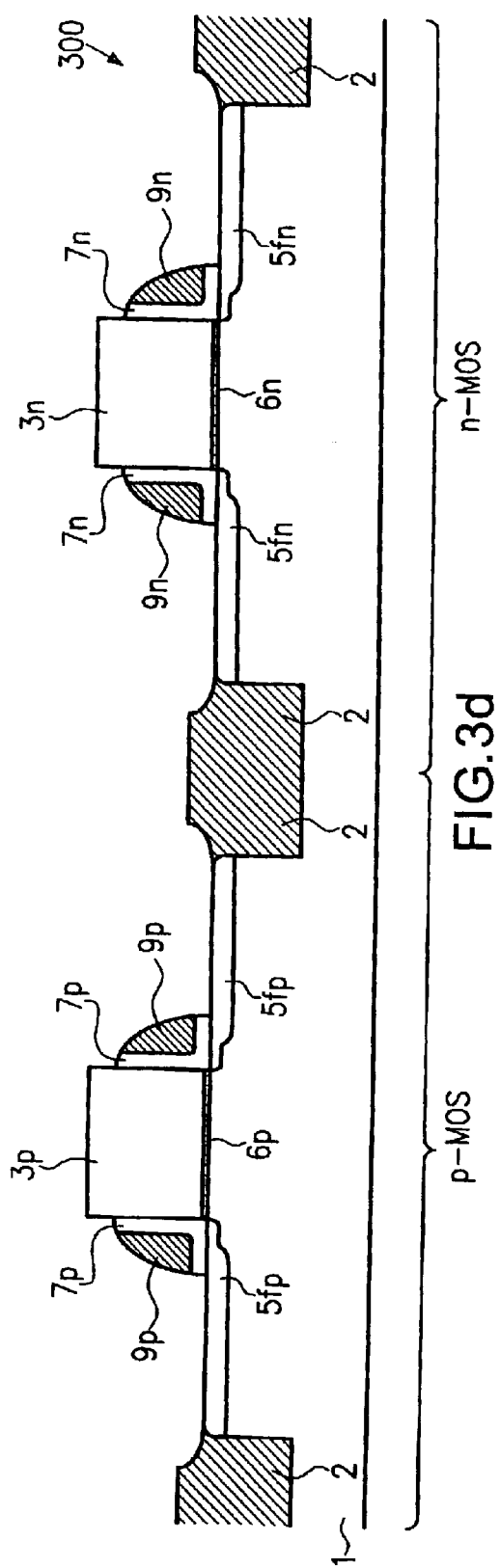

The dielectric spacers 4p and 4n are subsequently removed during a next etching step, as depicted in FIG. 3*c*, by performing any one of a variety of etching techniques well known in the art. Once the dielectric spacers 4p and 4n have been removed, a light implantation step is carried out to implant dopants into the exposed portions of the substrate, followed by a thermal treatment to diffuse the dopants into the substrate. At the end of this step, the doped regions $5fp$ and $5fn$ are obtained exhibiting a dopant concentration corresponding to the dopant concentration of the doped regions $5fp$ and $5fn$ obtained at the end of the process step depicted in FIG. 2d of the process sequence described above with reference to FIGS. 2a–2g. Again, the doped regions $5fp$ correspond to the source and drain regions of the PMOS transistor, while the doped regions $5fn$ correspond to the source and drain regions of the NMOS transistor.

The sequence is then continued with the removal of the dielectric layers $4p$ and $4n$, followed by the formation of the sidewall dielectric spacers $7p$, $9p$, $7n$ and $9n$, wherein the sidewall dielectric spacers do not cover the upper sidewall portions of the silicon lines $3p$ and $3n$. Finally, the metal silicide layers are formed on the source and drain regions $5fp$ and $5fn$ and on the upper surface and the exposed upper sidewall portions of the polysilicon lines $3p$ and $3n$. The sidewall dielectric spacers $7p$, $9p$, $7n$ and $9n$ of FIG. 3d, as well as the metal silicide layers (not depicted in FIG. 3d), are formed according to the same techniques as disclosed with reference FIGS. 2a–2g.

Since the dielectric spacers $4p$ and $4n$ are removed before forming the sidewall dielectric spacers $7p$, $9p$, $7n$ and $9n$, substantially no residual dielectric material is left on the sidewalls of the polysilicon lines $3p$ and $3n$, which reduces the dimension of the outer sidewall portions of the polysilicon lines $3p$ and $3n$ exposed during formation of the sidewall spacers $7p$, $9p$, $7n$ and $9n$ by overetching the oxide liner 7 and the nitride layer 9. The further process flow may be carried out as described with reference to FIGS. 2f–2g.

In conclusion, the present invention allows the formation of polysilicon line structures wherein the sidewall dielectric spacers do not cover the whole sidewalls of the polysilicon lines and the exposed upper sidewall portions are substantially free from residual dielectric material. Moreover, the present invention allows the realization of polysilicon line polysilicon structures, such as gate electrodes, interconnect lines, and the like, comprising metal silicide layers featuring substantially vertical portions of increased dimension, thus exhibiting a very low total sheet resistivity.

Furthermore, the method of the present invention allows relatively larger portions of the polysilicon gate electrodes and/or silicon lines to be converted into a silicide compared to the prior art methods, resulting in a significantly reduced line resistance, especially when extremely narrow lines of sophisticated semiconductor devices are considered. Finally, the process according to the present invention may readily be implemented in existing process flows without adding costs and/or complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming at least one feature of a silicon-containing semiconductive material on a substrate, said feature having sidewalls and an upper surface;
   forming a dielectric layer on said sidewalls of said at least one feature, said dielectric layer covering portions of said substrate adjacent said sidewalls;
   introducing dopant material into at least the portions of said substrate not covered by said feature and said dielectric layer on said sidewalls;
   removing said dielectric layer so as to expose the sidewalls of said feature; and
   forming spacer elements adjacent to a portion of said sidewalls, said elements covering less than all of said sidewalls and defining exposed upper sidewall portions, wherein forming said spacer elements comprises forming an underlying oxide liner of a first predefined thickness on at least the upper surface and the sidewalls of said at least one feature and depositing thereon a nitride layer of a second predefined thickness and selectively anisotropically overetching said nitride layer and said oxide liner until at least the upper surface and the upper sidewall portions of said at least one feature are exposed.

2. The method of claim 1, wherein forming said dielectric layer comprises forming said dielectric layer on at least the upper surface and the sidewalls of said at least one feature and anisotropically etching said dielectric layer so as to expose at least the upper surface of said at least one feature.

3. The method of claim 2, wherein said dielectric layer comprises at least one of silicon nitride and silicon oxide.

4. The method of claim 1, wherein introducing dopant material comprises implanting said dopant material at a predefined concentration and diffusing said dopant material during a thermal treatment.

5. The method of claim 1, wherein removing said dielectric layer comprises performing at least one of a dry etching and a wet etching process on said dielectric layer.

6. The method of claim 1, further comprising forming a metal silicide layer on at least the upper surface and the exposed upper sidewall portions of said at least one feature.

7. The method of claim 6, wherein forming a metal silicide layer comprises depositing at least one metal layer on at least the upper surface and the exposed upper sidewall portions of said at least one feature and reacting at least partially said metal into metal silicide by a thermal treatment.

8. The method of claim 7, further comprising removing unreacted metal after the thermal treatment by selective wet etching.

9. A method of forming a gate electrode, the method comprising:
   forming at least one polysilicon line above an active region of a substrate;
   introducing a first dopant material into at least one portion of said active region not covered by said at least one polysilicon line and into said at least one polysilicon line;
   forming a dielectric layer on the sidewalls of said at least one polysilicon line, said dielectric layer covering portions of said active region adjacent to said sidewalls;
   introducing a second dopant material into at least the portions of the active region not covered by said polysilicon line and said dielectric layer, wherein introducing said second dopant material comprises implanting said second dopant material at a second predefined concentration and diffusing said dopant material during a second thermal treatment;

removing said dielectric layer so as to expose the sidewalls of said at least one polysilicon line; and forming spacer elements adjacent to a portion of said sidewalls, said elements covering less than all of said sidewalls and defining exposed upper sidewall portions.

10. The method of claim 9, wherein forming said dielectric layer comprises forming a dielectric layer on at least the upper surface of said at least one polysilicon line and anisotropically etching said dielectric layer so as to expose at least the upper surface of said at least one polysilicon line.

11. The method of claim 10, wherein, said dielectric layer comprises at least one of silicon nitride, silicon oxide and a combination thereof.

12. The method of claim 9, wherein introducing said first dopant material comprises implanting said first dopant material at a first predefined concentration and diffusing said first dopant material during a first thermal treatment.

13. The method of claim 9, wherein removing said dielectric layer comprises performing at least one of a dry etching and a wet etching process on said dielectric layer.

14. The method of claim 9, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed.

15. The method of claim 9, further comprising forming a metal silicide layer on at least the upper surface and the exposed upper sidewall portions of said at least one polysilicon line.

16. The method of claim 15, wherein forming said metal silicide layer comprises depositing at least one metal layer on at least the upper surface and the exposed upper sidewall portions of said at least one polysilicon line and reacting at least partially said metal into metal silicide by a thermal treatment.

17. The method of claim 16, further comprising removing unreacted metal after the thermal treatment by selective wet etching.

18. A method, comprising:

forming at least one polysilicon line above a substrate;

introducing a first dopant material at a first predefined concentration into at least one portion of said substrate not covered by said at least one polysilicon line and into said at least one polysilicon line;

forming a dielectric layer on the sidewalls of said at least one polysilicon line, said dielectric layer covering portions of said substrate adjacent to said sidewalls;

introducing a second dopant material at a second predefined concentration higher than said first concentration into at least the portions of the substrate not covered by said polysilicon line and said dielectric layer, wherein introducing said second dopant material comprises implanting said dopant material at said second predefined concentration and diffusing said second dopant material during a second thermal treatment;

removing said dielectric layer so as to expose the sidewalls of said at least one polysilicon line;

forming spacer elements adjacent to a portion of said sidewalls, said elements covering less than all of said sidewalls and defining exposed upper sidewall portions; and forming a metal silicide layer on at least the upper surface and the exposed upper sidewall portions of said at least one polysilicon line.

19. The method of claim 18, wherein forming said dielectric layer comprises forming a dielectric layer on at least the upper surface and the sidewalls of said at least one polysilicon line and anisotropically etching said dielectric layer so as to expose at least the upper surface of said at least one polysilicon line.

20. The method of claim 19, wherein said dielectric layer comprises at least one of silicon nitride, silicon oxide and a combination thereof.

21. The method of claim 18, wherein introducing said first dopant material comprises implanting said first dopant material at said first predefined concentration and diffusing said first dopant material during a first thermal treatment.

22. The method of claim 18, wherein removing said dielectric layer comprises performing at least one of a dry etching and a wet etching process on said dielectric layer.

23. The method of claim 18, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed.

24. The method of claim 18, wherein forming a metal silicide layer comprises depositing at least one metal layer on said substrate and reacting at least partially said metal into metal silicide by a thermal treatment at the polysilicon-metal and silicon-metal interfaces.

25. The method of claim 24, further comprising removing unreacted metal after the thermal treatment by selective wet etching.

26. A method, comprising:

forming at least one polysilicon line above a substrate;

introducing a first dopant material at a first predefined concentration into at least one portion of said substrate not covered by said at least one polysilicon line and into said at least one polysilicon line;

forming a dielectric layer on the sidewalls of said at least one polysilicon line, said dielectric layer covering portions of said substrate adjacent to said sidewalls;

introducing a second dopant material at a second predefined concentration lower than said first concentration into at least the portions of the substrate not covered by said polysilicon line and said dielectric layer, wherein introducing said second dopant material comprises implanting said second dopant material at said second predefined concentration and diffusing said dopant material during a second thermal treatment;

removing said dielectric layer so as to expose the sidewalls of said at least one polysilicon line;

forming spacer elements adjacent to a portion of said sidewalls, said elements covering less than all of said sidewalls and defining exposed upper sidewall portions; and forming a metal suicide layer on at least the upper surface and the exposed upper sidewall portions of said at least one polysilicon line.

27. The method of claim 26, wherein forming said dielectric layer comprises forming said dielectric layer on at least the upper surface and the sidewalls of said at least one polysilicon line and anisotropically etching said dielectric layer so as to expose at least the upper surface of said at least one polysilicon line.

28. The method of claim 27, wherein said dielectric layer comprises at least one of silicon nitride, silicon oxide and a combination thereof.

29. The method of claim 26, wherein introducing said first dopant material comprises implanting said first dopant material at said first predefined concentration and diffusing said first dopant material during a first thermal treatment.

30. The method of claim 26, wherein removing said dielectric layer comprises performing at least one of a dry etching and a wet etching process on said dielectric layer.

31. The method of claim 26, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed.

32. The method of claim 26, wherein forming a metal silicide layer comprises depositing at least one metal layer on said substrate and reacting at least partially said metal into metal silicide by a thermal treatment at the polysilicon-metal and silicon-metal interfaces.

33. The method of claim 32, further comprising removing unreacted metal after the thermal treatment by selective wet etching.

34. A method of forming a gate electrode, the method comprising:
    forming at least one polysilicon line above an active region of a substrate;
    introducing a first dopant material into at least one portion of said active region not covered by said at least one polysilicon line and into said at least one polysilicon line;
    forming a dielectric layer on the sidewalls of said at least one polysilicon line, said dielectric layer covering portions of said active region adjacent to said sidewalls;
    introducing a second dopant material into at least the portions of the active region not covered by said polysilicon line and said dielectric layer;
    removing said dielectric layer so as to expose the sidewalls of said at least one polysilicon line; and
    forming spacer elements adjacent to a portion of said sidewalls, said elements covering less than all of said sidewalls and defining exposed upper sidewall portions, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed.

35. A method, comprising:
    forming at least one polysilicon line above a substrate;
    introducing a fist dopant material at a first predefined concentration into at least one portion of said substrate not covered by said at least one polysilicon line and into said at least one polysilicon line;
    forming a dielectric layer on the sidewalls of said at least one polysilicon line, said dielectric layer covering portions of said substrate adjacent to said sidewalls;
    introducing a second dopant material at a second predefined concentration higher than said first concentration into at least the portions of the substrate not covered by said polysilicon line and said dielectric layer;
    removing said dielectric layer so as to expose the sidewalls of said at least one polysilicon line;
    forming spacer elements adjacent to a portion of said sidewalls, said elements covering less than all of said sidewalls and defining exposed upper sidewall portions, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed; and
    forming a metal silicide layer on at least the upper surface and the exposed upper sidewall portions of said at least one polysilicon line.

36. A method, comprising:
    forming at least one polysilicon line above a substrate;
    introducing a first dopant material at a first predefined concentration into at least one portion of said substrate not covered by said at least one polysilicon line and into said at least one polysilicon line;
    forming a dielectric layer on the sidewalls of said at least one polysilicon line, said dielectric layer covering portions of said substrate adjacent to said sidewalls;
    introducing a second dopant material at a second predefined concentration lower than said first concentration into at least the portions of the substrate not covered by said polysilicon line and said dielectric layer;
    removing said dielectric layer so as to expose the sidewalls of said at least one polysilicon line;
    forming spacer elements adjacent to a portion of said sidewalls, said elements covering less than all of said sidewalls and defining exposed upper sidewall portions, wherein forming spacer elements comprises forming an underlying oxide liner of a first predefined thickness on at least the upper surface and the sidewalls of said at least one polysilicon line and depositing thereon a nitride layer of a second predefined thickness and selectively anisotropically overetching said nitride layer and said oxide liner until at least the upper surface and the upper sidewall portions of said at least one polysilicon line are exposed; and
    forming a metal silicide layer on at least the upper surface and the exposed upper sidewall portions of said at least one polysilicon line.

* * * * *

UNITED STATES PATENT AND TRADEMARK OFFICE
CERTIFICATE OF CORRECTION

PATENT NO. : 6,746,927 B2
DATED : June 8, 2004
INVENTOR(S) : Thorsten Kammler, Karsten Wieczorek and Christof Streck It is certified that error appears in the above-identified patent and that said Letters Patent is hereby corrected as shown below:

Column 13,
Line 12, after "surface" insert -- and said sidewalls --.
Line 15, delete the comma after "wherein".

Column 14,
Line 61, change "suicide" to -- silicide --.

Column 15,
Line 62, change "fist" to -- first --.

Signed and Sealed this

Fourteenth Day of December, 2004

JON W. DUDAS
*Director of the United States Patent and Trademark Office*